United States Patent
Shimofuku et al.

(10) Patent No.: US 9,085,145 B2
(45) Date of Patent: Jul. 21, 2015

(54) METHOD OF FORMING ELECTROMECHANICAL TRANSDUCER FILM, ELECTROMECHANICAL TRANSDUCER FILM, ELECTROMECHANICAL TRANSDUCER ELEMENT, AND LIQUID DISCHARGE HEAD

(71) Applicants: Akira Shimofuku, Kanagawa (JP); Osamu Machida, Kanagawa (JP); Ryoh Tashiro, Kanagawa (JP); Yasuhiro Watanabe, Kanagawa (JP)

(72) Inventors: Akira Shimofuku, Kanagawa (JP); Osamu Machida, Kanagawa (JP); Ryoh Tashiro, Kanagawa (JP); Yasuhiro Watanabe, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/243,177

(22) Filed: Apr. 2, 2014

(65) Prior Publication Data
US 2014/0210913 A1    Jul. 31, 2014

Related U.S. Application Data

(62) Division of application No. 13/486,075, filed on Jun. 1, 2012, now Pat. No. 8,727,509.

(30) Foreign Application Priority Data

Jun. 9, 2011 (JP) .................................. 2011-129418

(51) Int. Cl.
*B41J 2/045* (2006.01)
*H01L 41/22* (2013.01)
(Continued)

(52) U.S. Cl.
CPC .............. *B41J 2/14201* (2013.01); *B41J 2/161* (2013.01); *B41J 2/164* (2013.01); *H01L 41/047* (2013.01)

(58) Field of Classification Search
CPC ...... B41J 2/14233; B41J 2/161; B41J 2/1623; B41J 2/1632; B41J 2/14209; B41J 2002/14258
See application file for complete search history.

(56) References Cited

U.S. PATENT DOCUMENTS 6,127,129 A    10/2000    Corn et al.
2004/0101980 A1    5/2004    Kurokawa et al.
(Continued)

FOREIGN PATENT DOCUMENTS

JP    4-168277    6/1992
(Continued)

OTHER PUBLICATIONS

Budd, K.D., et al. (1985), "Sol-Gel Processing of $PbTiO_3$, $PbZrO_3$, PZT, and PLZT Thin Films" Proc. Brit. Ceram. Soc. 36, pp. 107-121.
(Continued)

*Primary Examiner* — Lisa M Solomon
(74) *Attorney, Agent, or Firm* — Cooper & Dunham LLP (57) ABSTRACT

Disclosed is an electromechanical transducer film forming method including a surface modification process; an application process; and processes of drying, thermally decomposing, and crystallizing sol-gel solution applied to a portion of a surface of a first electrode. An electromechanical transducer film is formed on a desired pattern area on the surface of the first electrode by repeating the above processes. In the application process, each of dots of the sol-gel solution applied by the inkjet method drops onto both a first area inside the desired pattern area and a second area outside the desired pattern area. The first area is a hydrophilic area on the surface of the first electrode, and the second area is a hydrophobic area on the surface of the first electrode. The hydrophilic area and the hydrophobic area have been modified by the surface modification process.

3 Claims, 7 Drawing Sheets (51) Int. Cl.
*H04R 17/00* (2006.01)
*B41J 2/14* (2006.01)
*B41J 2/16* (2006.01)
*H01L 41/047* (2006.01)

(56) References Cited

U.S. PATENT DOCUMENTS

| | | |
|---|---|---|
| 2004/0238816 A1 | 12/2004 | Tano et al. |
| 2005/0179342 A1 | 8/2005 | Higuchi et al. |
| 2011/0175967 A1 | 7/2011 | Machida et al. |
| 2011/0205307 A1 | 8/2011 | Ueda et al. |
| 2012/0038712 A1 | 2/2012 | Akiyama et al. |

FOREIGN PATENT DOCUMENTS

| | | |
|---|---|---|
| JP | 2002-543429 | 12/2002 |
| JP | 2003-133691 | 5/2003 |
| JP | 2003-297825 | 10/2003 |
| JP | 2003-311196 | 11/2003 |
| JP | 2004-89878 | 3/2004 |
| JP | 2004-351305 | 12/2004 |
| JP | 2005-12173 | 1/2005 |
| JP | 2005-310962 | 11/2005 |
| JP | 4432776 | 1/2010 |
| JP | 2011-18836 | 1/2011 |

OTHER PUBLICATIONS

Kumar, Amit, et al. (1993), "Features of gold having micrometer to centimeter dimensions can be formed through a combination of stamping with an elastomeric stamp and an alkanethiol "ink" followed by chemical etching," Appl. Phys. Lett. 63 (14), pp. 2002-2004.

Apr. 27, 2015 Japanese official action in corresponding Japanese patent application No. 2011-129418.

FIG.3A FIRST EMBODIMENT 1/2

FIG.3B FIRST EMBODIMENT 1/3

FIG.3C COMPARATIVE EXAMPLE 1/3

METHOD OF FORMING ELECTROMECHANICAL TRANSDUCER FILM, ELECTROMECHANICAL TRANSDUCER FILM, ELECTROMECHANICAL TRANSDUCER ELEMENT, AND LIQUID DISCHARGE HEAD

CROSS-REFERENCE TO RELATED APPLICATIONS

This application is a divisional of U.S. application Ser. No. 13/486,075, filed Jun. 1, 2012, claiming the priority of Japanese Patent Application No. 2011-129418 filed with the Japanese Patent Office on Jun. 9, 2011.

BACKGROUND OF THE INVENTION

1. Field of the Invention

Embodiments of the present invention relate to a method of forming an electromechanical transducer film, the electromechanical transducer film, an electromechanical transducer element, a liquid discharge head, and an image forming device. Specifically, the embodiments of the present invention relate to an electromechanical transducer element, an electromechanical transducer film included in the electromechanical transducer element, and a method of forming the electromechanical transducer film that are utilized as a piezoelectric element of a liquid discharge head included in an inkjet recording device; a printing machine, such as a printer, a facsimile machine, a copier, a plotter, and a screen printing machine; or a combined machine having the functions of these devices.

2. Description of the Related Art

In an inkjet recording device which is utilized as an image recording device, such as a printer, a facsimile machine, or a copier; or as an image forming device, an image is formed by discharging ink droplets from a recording head onto an object, such as a sheet, which is utilized as a recording medium. The recording head includes a nozzle for discharging ink droplets; a pressurizing chamber that communicates with the nozzle (also referred to as an ink flow channel, a pressurized liquid chamber, a pressure chamber, a discharge chamber, or a liquid chamber); and an electromechanical transducer element (e.g., a piezoelectric element) that applies pressure to the ink in the pressurizing chamber, an electrothermal conversion element (e.g., a heater), or an energy generating unit formed of an oscillation plate forming a wall surface of the ink flow channel and an electrode facing the oscillation plate. In the recording head, the ink in the pressurizing chamber is pressed by energy generated by the energy generating unit or the like, thereby discharging the ink droplets from the nozzle (cf. Patent Document 1 (Japanese Unexamined Published Application No. H04-168277), Patent Document 2 (Japanese Unexamined Published Application No. 2003-297825), and Patent Document 3 (Japanese Registered Patent No. 4432776)). Patent Document 3 discloses a configuration of a recording head including a piezoelectric element in which a lower electrode disposed on a substrate (a first electrode); an electromechanical transducer layer; and an upper electrode (a second electrode) are laminated.

In general, in the recording head, independent piezoelectric elements for generating the pressure for causing the corresponding pressurizing chambers to discharge the ink are arranged. The piezoelectric elements are referred to as electromechanical transducer elements. The electromechanical transducer element converts an electrical input into a mechanical deformation. The electromechanical transducer element has a laminated structure such that a film of a piezoelectric material is sandwiched between an upper electrode and a lower electrode for inputting en electric signal. As the piezoelectric material, ceramics of lead zirconate titanate (hereinafter, abbreviated as "PZT") and the like are utilized. Since the main components of these materials are plural metal oxides, these materials are usually referred to as metal composite oxides.

(Conventional Method of Forming Individual Piezoelectric Element)

A piezoelectric film is formed on a lower electrode by a known film formation method, such as various vacuum deposition methods (e.g., the sputtering method, the MO-CVD method (e.g., a chemical vapor deposition using a metal organic compound), the vacuum evaporation method, and the ion plating method), the sot-gel method, the hydrothermal synthesis method, the aerosol deposition method (abbreviated as "AD method"), and the metal organic deposition (MOD). Subsequently, after the upper electrode is formed, patterning by photography and etching is performed on the upper electrode. Similarly, patterning is performed on the piezoelectric film and the lower electrode, and thereby independent piezoelectric elements are formed.

The dry etching is not easily applied to a metal composite oxide, especially to the PZT. A Si semiconductor device can be easily etching-processed by the reactive ion etching (abbreviated as "RIE"). However, for such a material, a special PIE, in which ICP plasma, ECR plasma, and helicon plasma are used together, is performed to increase plasma energy of ionic species. Such a method results in a higher cost. Further, it is difficult to improve the selectivity between such a material and the lower electrode film. Especially, for a substrate having a large surface area, nonuniformity in the etching rate can be a major obstacle for forming a film. The above manufacturing process can be emitted, if desired portions are coated with the PZT films in advance, since the PZT films are difficult to be etched. However, such an attempt has not been made, with a few exceptions.

Incidentally, Non-Patent Document 1 (K. D. Budd, S. K. Dey, D. A. Payne, Proc. Brit. Ceram. Soc. 36, 107 (1985)) discloses a technique for forming a thin film of a metal composite oxide by the sol-gel method. Further, Non-Patent Document 2 (A. Kumar and G. M. Whitesides, Appl. Phys. Lett., 63, 2002 (1993)) discloses that a film of alkanethiol can be formed on a film of Au as a Self Assembled Monolayer (SAM). Additionally, Non-Patent Document 2 discloses that a SAM pattern can be copied using the micro-contact printing method which utilizes the above phenomenon, and the SAM pattern can be utilized for a subsequent process, such as the etching process.

(Conventional Example of Forming Separated PZT Films)

Conventional methods of forming separated PZT films include the hydrothermal method, the vacuum deposition method, the AD method, and the inkjet method. It has been known that, in the inkjet method, a PZT precursor solution (sol-gel solution) can be applied by discharging the liquid droplets at high resolution.

In the inkjet method, higher resolution may be required, as a desired pattern becomes finer. Here, the pattern is formed by applying the sol-gel solution, which has become like an ink by the inkjet method, to a surface of a metal on which a first electrode is formed. In order to form a high-resolution pattern, sizes of the sol-gel solution droplets discharged from the nozzle of the inkjet head are reduced. However, when the sizes of the sol-gel solution droplets are reduced, the weight of each of the sol-gel solution droplets is reduced. Therefore, becomes difficult to control the positions where the sol-gel solution droplets are adhered to, and it becomes difficult to form a desired pattern. Further, as the sizes of the sol-gel solution droplets are reduced, mist of the sol-gel solution tends to be generated from the nozzle of the inkjet head. Since sizes of droplets included in the mist are smaller than those of the sol-gel solution droplets (the dot diameter of each of the droplets of the mist is less than or equal to a quarter of the dot diameter of the sol-gel solution droplet), the droplets of the mist tend to be scattered in various directions from the vicinity of the nozzle surface. Hence, the sol-gel solution may be adhered to outside an area of a desired pattern. Therefore, many defects may be formed on the surface of the metal that forms the first electrode, and consequently stability becomes insufficient as an electromechanical transducer element.

On the other hand, even if the sol-gel solution droplets, whose sizes have been reduced, are adhered to inside the area of the desired pattern, since the amount of the solution is small, it is difficult to ensure a large area, which includes the position where the sol-gel solution droplet has been adhered to, for leveling the sol-gel solution on the surface of the metal that forms the first electrode, even though the surface of the metal is highly hydrophilic. Therefore, the sol-gel solution does not spread to edges of the desired pattern. Further, if it takes a relatively long time for drying the sol-gel droplets after they have been adhered to the surface, the dots of the neighboring sol-gel solution droplets, which have been adhered to the surface of the metal forming the first electrode, clump together and are locally integrated in the desired pattern to be formed. When the electromechanical transducer film is formed by applying the drying process, the thermal decomposition process, and the crystallization process to the sol-gel solution in this condition, the area of the formed electromechanical transducer film may be narrower than the area of the desired pattern. Furthermore, since the film thickness on the surface may become uneven, cracks tend to occur. In addition, because of the unevenness of the generated film, the electrical characteristic of the electromechanical element formed of the film may be insufficient.

SUMMARY OF THE INVENTION

The embodiments of the present invention have been developed in view of the above problems. Objectives of the embodiments are to provide an electromechanical transducer film in which less cracks may occur; an electromechanical transducer element with a stable electrical characteristic; a liquid discharge head having a stable ink droplet discharging characteristic; and an image forming device including the liquid discharge head that can form high-quality images.

In one aspect, there is provided an electromechanical transducer film forming method including a surface modification process of modifying a portion of a surface of a first electrode; an application process of applying a sol-gel solution to the portion of the surface of the first electrode by an inkjet method, the portion of the surface of the first electrode having been modified by the surface modification process; and processes of drying, thermally decomposing, and crystallizing the sol-gel solution applied to the portion of the surface of the first electrode by the application process. Here, an electromechanical transducer film having a desired thickness is formed on a desired pattern area on the surface of the first electrode by repeating the surface modification process, the application process, and the processes of drying, thermally decomposing, and crystallizing the sol-gel solution. In the application process of the electromechanical transducer film forming method, each of dots of the sol-gel solution applied by the inkjet method drops onto both a first area inside the desired pattern area and a second area outside the desired pattern area. The first area is included in a hydrophilic area on the surface of the first electrode, the hydrophilic area having been modified by the surface modification process, and the second area is included in a hydrophobic area on the surface of the first electrode, the hydrophobic area having been modified by the surface modification process.

In another aspect, there is provided an electromechanical transducer film formed as layers. Here, the layers are formed by repeatedly performing a method including a surface modification process of modifying a portion of a surface of a first electrode; an application process of applying a sol-gel solution to the portion of the surface of the first electrode by an inkjet method, the portion of the surface of the first electrode having been modified by the surface modification process; and processes of drying, thermally decomposing, and crystallizing the sol-gel solution applied to the portion of the surface of the first electrode by the application process. Each of the layers having a desired thickness is formed on a desired pattern area on the surface of the first electrode by repeating the surface modification process, the application process, and the processes of drying, thermally decomposing, and crystallizing the sol-gel solution. In the application process of the method, each of dots of the sol-gel solution applied by the inkjet method drops onto both a first area inside the desired pattern area and a second area outside the desired pattern area. The first area is included in a hydrophilic area on the surface of the first electrode, the hydrophilic area having been modified by the surface modification process, and the second area is included in a hydrophobic area on the surface of the first electrode, the hydrophobic area having been modified by the surface modification process.

In another aspect, there is provided an electromechanical transducer film formed by laminating plural layers. Here, each of the plural layers is formed by repeatedly performing a method including a surface modification process of modifying a portion of a surface of a first electrode; an application process of applying a sol-gel solution to the portion of the surface of the first electrode by an inkjet method, the portion of the surface of the first electrode having been modified by the surface modification process; and processes of drying, thermally decomposing, and crystallizing the sol-gel solution applied to the portion of the surface of the first electrode by the application process. Each of the layers having a desired thickness is formed on a desired pattern area on the surface of the first electrode by repeating the surface modification process, the application process, and the processes of drying, thermally decomposing, and crystallizing the sol-gel solution. In the application process of the method, each of dots of the sol-gel solution applied by the inkjet method drops onto both a first area inside the desired pattern area and a second area outside the desired pattern area. The first area is included in a hydrophilic area on the surface if of the first electrode, the hydrophilic area having been modified by the surface modification process, and the second area is included in a hydrophobic area on the surface of the first electrode, the hydrophobic area having been modified by the surface modification process.

In another aspect, there is provided an electromechanical transducer element including a first electrode; a second electrode; and an electromechanical transducer film disposed between the first electrode and the second electrode. Here, the electromechanical transducer film is formed as layers, and the layers are formed by repeatedly performing a method including a surface modification process of modifying a portion of a surface of a first electrode; an application process of applying a sol-gel solution to the portion of the surface of the first electrode by an inkjet method, the portion of the surface of the first electrode having been modified by the surface modification process; and processes of drying, thermally decomposing, and crystallizing the sol-gel solution applied to the portion of the surface of the first electrode by the application process. Each of the layers having a desired thickness is formed on a desired pattern area on the surface of the first electrode by repeating the surface modification process, the application process, and the processes of drying, thermally decomposing, and crystallizing the sol-gel solution. In the application process of the method, each of dots of the sol-gel solution applied by the inkjet method drops onto both a first area inside the desired pattern area and a second area outside the desired pattern area. The first area is included in a hydrophilic area on the surface of the first electrode, the hydrophilic area having been modified by the surface modification process, and the second area is included in a hydrophobic area on the surface of the first electrode, the hydrophobic area having been modified by the surface modification process.

In another aspect, there is provided a liquid discharge head that utilizes an electromechanical transducer element. Here, the electromechanical transducer element includes a first electrode; a second electrode; and an electromechanical transducer film disposed between the first electrode and the second electrode. The electromechanical transducer film is formed as layers, and the layers are formed by repeatedly performing a method including a surface modification process of modifying a portion of a surface of a first electrode; an application process of applying a sol-gel solution to the portion of the surface of the first electrode by an inkjet method, the portion of the surface of the first electrode having been modified by the surface modification process; and processes of drying, thermally decomposing, and crystallizing the sol-gel solution applied to the portion of the surface of the first electrode by the application process. Each of the layers having a desired thickness is formed on a desired pattern area by repeating the surface modification process, the application process, and the processes of drying, thermally decomposing, and crystallizing the sol-gel solution. In the application process of the method, each of dots of the sol-gel solution applied by the inkjet method drops onto both a first area inside the desired pattern area and a second area outside the desired pattern area. The first area is included in a hydrophilic area on the surface of the first electrode, the hydrophilic area having been modified by the surface modification process, and the second area is included in a hydrophobic area on the surface of the first electrode, the hydrophobic area having been modified by the surface modification process. Here, the electromechanical transducer film is formed of a metal complex oxide, and top surfaces of the first electrode and the second electrode include corresponding electrodes. Each of the corresponding electrodes is formed of a platinum group metal, an oxide of a platinum group metal, or a laminated film including several types of platinum group metals and/or oxides of several types of platinum group metals.

In another aspect, there is provided an image forming device including a liquid discharge head that utilizes an electromechanical transducer element. Here, the electromechanical transducer element includes a first electrode; a second electrode; and an electromechanical transducer film disposed between the first electrode and the second electrode. Here, the electromechanical transducer film is formed as layers, and the layers are formed by repeatedly performing a method including a surface modification process of modifying a portion of a surface of a first electrode; an application process of applying a sol-gel solution to the portion of the surface of the first electrode by an inkjet method, the portion of the surface of the first electrode having been modified by the surface modification process; and processes of drying, thermally decomposing, and crystallizing the sol-gel solution applied to the portion of the surface of the first electrode by the application process. Each of the layers having a desired thickness is formed on a desired pattern area by repeating the surface modification process, the application process, and the processes of drying, thermally decomposing, and crystallizing the sol-gel solution. In the application process of the method, each of dots of the sol-gel solution applied by the inkjet method drops onto both a first area inside the desired pattern area and a second area outside the desired pattern area. The first area is included in a hydrophilic area on the surface of the first electrode, the hydrophilic area having been modified by the surface modification process, and the second area is included in a hydrophobic area on the surface of the first electrode, the hydrophobic area having been modified by the surface modification process. Here, the electromechanical transducer film is formed of a metal complex oxide, and top surfaces of the first electrode and the second electrode include corresponding electrodes. Each of the corresponding electrodes is formed of a platinum group metal, an oxide of a platinum group metal, or a laminated film including several types of platinum group metals and/or oxides of several types of platinum group metals.

According to the embodiments, a novel method of forming the electromechanical transducer film, a novel electromechanical transducer film, a novel electromechanical transducer element, a novel liquid discharge head, and a novel image forming device having the liquid discharge head can be realized and provided. With these, the above objectives can be achieved. Namely, according to the embodiments, in the application process, the droplets of the sol-gel solution applied by the inkjet method are adhered to both inside the area of the desired pattern corresponding to the hydrophilic area and outside the area of the desired pattern corresponding to the hydrophobic area. Here, the surfaces of the hydrophilic area and the hydrophobic area are modified by the surface modification process. Among the droplets of the sol-gel solution adhered to, the droplets adhered to outside the area of the desired pattern are attracted toward inside the area of the desired pattern, and the droplets are leveled inside the desired pattern to be formed. Therefore, when the electromechanical transducer film is formed of the sol-gel solution through the drying process, the thermal decomposition process, and the crystallization process, the film thickness becomes even and the cracks are prevented from occurring. Therefore, the electric characteristic of the electromechanical transducer element formed of the film is stable. Further, since the electric characteristic of the electromechanical transducer element is stable, an ink discharging failure in the ink discharge head including the electromechanical transducer element is prevented from occurring. Therefore, the ink discharging characteristic of the ink discharging head is stabilized, and the quality of the images formed by the image forming device including the ink discharging head is improved.

Other objects, features and advantages of the present invention will become more apparent from the following detailed description when read in conjunction with the accompanying figures.

BRIEF DESCRIPTION OF THE DRAWINGS

FIG. 7 is a schematic perspective view in which major portions of the inkjet recording device of FIG. 6 are seen through.

DETAILED DESCRIPTION OF THE PREFERRED EMBODIMENTS

Hereinafter, the embodiments of the present invention are explained by referring to the accompanying figures. In the explanations of the embodiments, the same reference numeral is assigned to elements having, for example, the same functions or the same shapes, as long as these are identifiable, so as to avoid overlapped explanations. Here, descriptions of the embodiments are for exemplifying purpose only, and the embodiments are not limited to the descriptions.

An image forming device according to the embodiments is usually referred to as an inkjet recording device. Thus, hereinafter, the image forming device is referred to as the inkjet recording device. The inkjet recording device has many advantages. For example, the inkjet recording device can perform high-speed printing while generating a very small noise. Further, with the inkjet recording device, a wide range of inks can be utilized and a plain paper, which is a less expansive recording medium, can be used. Therefore, the inkjet recording device is widely adopted as a printer, a facsimile machine, a copier, an image recording device, such as a combined machine having plural image forming functions, or an image forming device.

A liquid discharge head which is utilized in the inkjet recording device includes a nozzle for discharging ink droplets; a liquid chamber communicating with the nozzle; and a pressure generating unit for discharging ink inside the liquid chamber. Examples of the pressure generating unit include a piezoelectric-type pressure generating unit that causes the ink droplets to be discharged by deforming an oscillation plate forming a wall surface of a liquid chamber by using an electromechanical transducer element, such as a piezoelectric element; and a bubble-type (thermal-type) pressure generating unit that causes the ink droplets to be discharged by generating bubbles of the ink by boiling the ink using an electro-thermal conversion element, such as a heat-generating resistance element, disposed in the liquid chamber. Further, examples of the piezoelectric-type pressure generating unit includes a longitudinal vibration type that utilizes the deformation in the $d_{33}$ direction, a lateral vibration (bend mode) type that utilizes the deformation in the $d_{31}$ direction, and a share mode type that utilizes the shear deformation. Recently, due to the progress in the semiconductor process and in the Micro Electronic Mechanical Systems (MEMS), a thin film actuator has been developed, for which the liquid chamber and the piezoelectric element are directly formed on a Si substrate. The electromechanical transducer element that functions as the pressure generating unit according to the embodiments is the lateral vibration (bend mode) type pressure generating unit that utilizes the deformation in the $d_{31}$ direction.

First, a method of forming a patterned electromechanical transducer film (layer) utilizing the sol-gel method is explained.

(1) A sol-gel solution (hereinafter, referred to as the PZT precursor solution) for controlling the wettability of a base substrate is applied to predetermined portions of the base substrate. This is a phenomena such that alkanethiol is self-assembled on a specific metal.

(2) A self-assembled monolayer (hereinafter, referred to as a SAM film) is formed on a platinum group metal by thiol.

(3) As a material of a lower electrode (first electrode), Pt (platinum) is utilized, and a SAM film forming process is applied to the whole surface of the lower electrode. Since alkyl groups are arranged on the SAM film, the lower electrode becomes hydrophobic.

(4) The SAM film is pattern-processed by the known photolithography etching process.

(5) Since, after peeling off the resists, the patterned SAM film remains on the lower electrode, the portion of the surface of the lower electrode where the patterned SAM film remains becomes hydrophobic. On the other hand, since portions of the surface of the lower electrode, from which the resists have been peeled off, are the surfaces of the platinum, the portions become hydrophilic.

Here, the above processes from (1) through (5) correspond to a surface modification process for modifying the portion of the surface of the lower electrode (first electrode).

(6) The PZT precursor solution (sol-gel solution) is applied to the hydrophilic portion by the inkjet method. By a contrast between surface energies, the PZT precursor solution is only applied to the hydrophilic portion. The viscosity and the surface tension of the PZT precursor solution are adjusted, so that the PZT precursor solution can be applied by using the inkjet head. Here, the process of (6) corresponds to an application process for applying the PZT precursor solution (sol-gel solution) to a portion of the hydrophilic area on the surface of the lower electrode, where the surface modification process has been applied.

In this manner, a first patterned PZT precursor film is formed on the base substrate by the inkjet method, and subsequently the thermal processing is applied in accordance with the usual sol-gel process. The process at and after the second time can be simplified, because of the following reason.

The SAM film is not formed on a thin film of oxide. Therefore, the SAM film is formed only on the film of platinum, which is not covered with the PZT film because of the process of (1) described above.

The SAM film forming process is applied to the base substrate on which the first patterned PZT precursor film is formed. Subsequently, the PZT precursor solution is applied to the predetermined portions by the inkjet method, and the thermal processing is applied.

Here, the processes that follow the application process correspond to a drying process, a thermal decomposition process, and a crystallization process applied to the sol-gel solution, applied to the portion of the base substrate by the application process.

(7) The surface modification process, the application process, the drying process, the thermal decomposition process, and the crystallization process are repeated until the thickness of the precursor film becomes a predetermined thickness. With such a pattern forming method, a ceramic film having a thickness of up to 5 µm may be formed. Namely, one of the features of the embodiments is that the PZT precursor solution (sol-gel solution) is applied by the inkjet method. With such a method, amounts of the materials for forming the film are reduced compared to those of a conventional method, in which a spin coater is utilized for coating. Thus, the process is significantly simplified.

Hereinafter, details of a first embodiment through a fifth embodiment are explained by referring to the accompanying figures.

First Embodiment

Figure 1A:
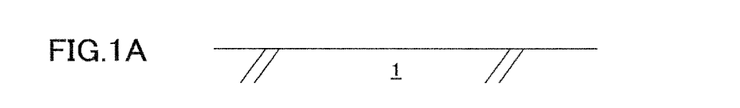
FIGS. 1A-1D are schematic cross-sectional views illustrating a surface modification process in an electromechanical transducer film forming method according to a first embodiment.
Figure 1B:
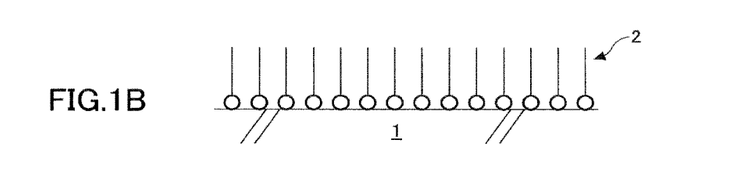
Figure 1C:
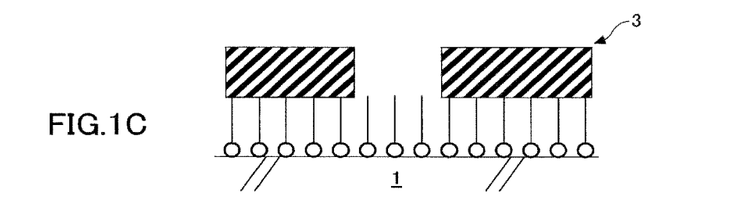
Figure 1D:
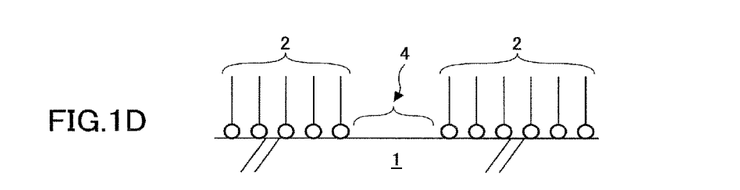

Hereinafter, the first embodiment of the method of forming the electromechanical transducer film by the sol-gel method is explained. FIGS. 1A-1D are schematic cross-sectional views illustrating the surface modification process for modifying the portion of the surface of a substrate 1. An electrode formed of platinum (Pt) (not shown) is formed as the first electrode or the lower electrode on the substrate 1 shown in FIG. 1A. FIG. 1B shows a state in which a SAM film 2 is formed or the whole surface of the substrate 1. The SAM film 2 is obtained by causing alkanethiol to be self-assembled by dipping the substrate 1 into an alkanethiol solution. Here, 1-dodecanethiol ($CH_3(CH_2)_{11}SH$) is utilized. FIG. 1C shows a state in which photo resist layers 3 are pattern formed by photolithography, so as to remove a portion of the SAM film 2 placed at a position where the PZT precursor film is to be formed, and to protect a necessary portion of the SAM film 2. In the state shown in FIG. 1C, for example, by irradiating oxygen plasma onto the surface of the substrate 1, the portion of the SAM film 2 placed at the position where the PST precursor film is to be formed is removed. FIG. 1D shows a state in which the photo resist layers 3 have been peeled off, after the SAM film 2 has been removed. A contact angle of pure water with respect to the SAM film 2 formed by this process is 116 degrees and indicates a hydrophobic property (water-repellent property), and a contact angle of pure water with respect to Pt on a portion 4 (hereinafter, referred to as the hydrophilic area 4) on the substrate 1 is less than or equal to 10 degrees, and it indicates a hydrophilic property. In the first embodiment, the example has been explained in which the SAM film 2 is removed by oxygen plasma. However, the first embodiment is not limited to this. For example, the portion of the SAM film 2 may be removed by irradiating UV light (ultraviolet light).

Figure 2A:
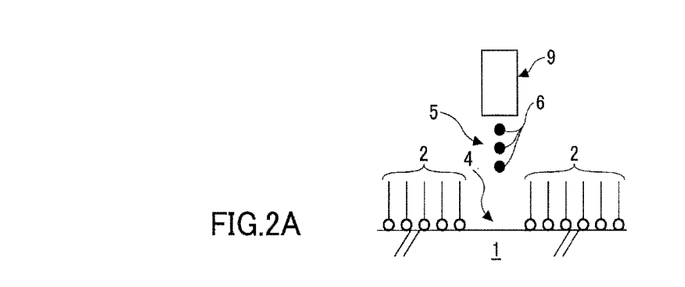
FIGS. 2A-2G are schematic cross-sectional views illustrating an application process, a drying process, a thermal decomposition process, and a crystallization process following the surface modification process in the electromechanical transducer film forming method according to the first embodiment, a second embodiment, and a third embodiment.

Next, an application process and method for applying the PZT precursor solution to the hydrophilic area 4 on the substrate 1 by the inkjet method is explained by referring to FIGS. 2A-2G. The hydrophilic area 4 has been formed on the substrate 1 through the surface modification process of FIGS. 1A-1D. Hereinafter, the sol-gel solution may be also referred to as the PZT precursor liquid or the PZT precursor solution. As shown in FIG. 2A, the PZT precursor solution (sol-gel solution) 5 is applied to the hydrophilic area 4 using an inkjet application device including an inkjet head 9. The hydrophilic area 4 has been patterned in the surface modification process of FIGS. 1A-1D. As the starting materials of the PZT precursor solution (sol-gel solution) 5, lead acetate trihydrate, titanium isopropoxide, and zirconium isopropoxide have been used. After dissolving crystallization water of lead acetate into methoxyethanol, the resultant mixture is dehydrated. An amount of lead is adjusted to exceed by a 10% mole fraction the amount of lead defined by the stoichiometric composition. This is for preventing a so-called "degradation of crystallinity caused by insufficient lead." A PZT precursor solution 5 is synthesized as follows. First, titanium isopropoxide and zirconium isopropoxide are dissolved into methoxyethanol. Then the alcohol exchange reaction and the esterification reaction are accelerated. The resultant solution is mixed with the above methoxyethanol solution, in which lead acetate is dissolved, and thereby the PZT precursor solution 5 is obtained. The molar concentration of the PZT in the PZT precursor solution 5 is adjusted to be 0.1 mol/L.

Figure 3A:
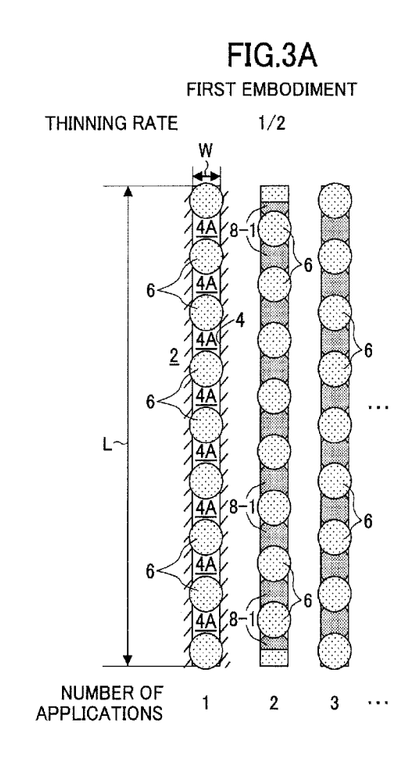
FIG. 3A is a schematic plan view showing a state in which droplets of a PZT precursor solution (sol-gel solution) are dropped onto and adhered to a fine-line pattern area while setting a thinning rate to 1/2, and a transition state of the dropped and adhered droplets for each number of times of the application of the solution, in the first embodiment.
Figure 3B:
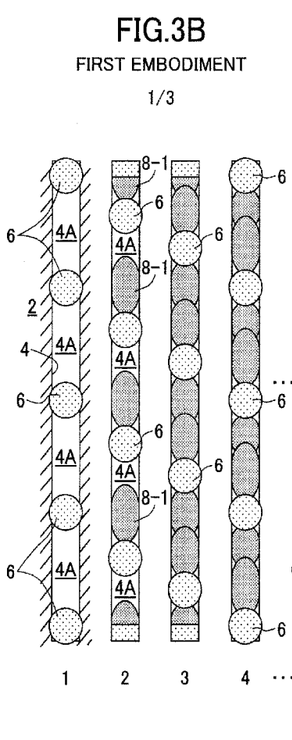
FIG. 3B is a schematic plan view showing a state in which the droplets of the PZT precursor solution (sol-gel solution) are dropped onto and adhered to the fine-line pattern area while setting the thinning rate to 1/3, and a transition state of the dropped and adhered droplets for each number of times of the application of the solution, in the first embodiment.
Figure 3C:
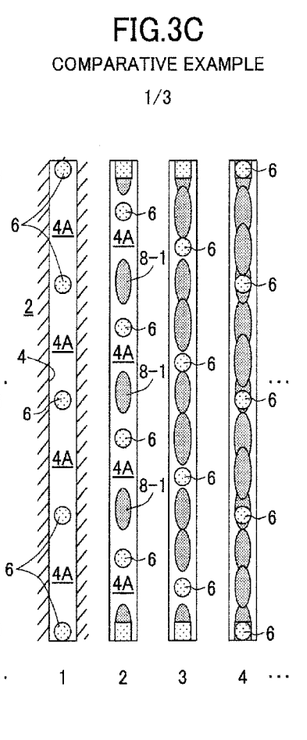
FIG. 3C is a schematic plan view showing a state in which the droplets of the PZT precursor solution (sol-gel solution) are dropped onto and adhered to the fine-line pattern area while setting the thinning rate to 1/3, and a transition state of the dropped and adhered droplets for each number of times of the application of the solution, in a comparative example.

As shown in FIG. 3A, by taking advantage of the inkjet method, dots of liquid droplets 6 of the PZT precursor solution 5 are applied to a thin line area (the hydrophilic area 4), which is a desired pattern area, while the dots are evenly spaced apart. The PZT precursor solution 5 has been synthesized in the above described solvent system and reaction system. The thin line area (the hydrophilic area 4) has a width W of 30 µm and a length L of 1 mm. The number of applications of the PZT precursor solution 5 is varied depending on the spacing between the dots, and eventually a single precursor layer pattern is formed. In FIGS. 3A, 3B, and 3C, the hatched portions (slant line portions) are outside the areas where the PZT precursor solution 5 is applied, and the blank portions are the areas where the PZT precursor solution 5 is applied. The hatched portions are the hydrophobic portions or hydrophobic areas (water-repelling portions or water-repelling areas), on which the SAM films 2 are formed. The blank portions are the hydrophilic areas 4. Here, in order to simplify the figures, the hatching is only applied to the portions (the water-repelling portions or water-repelling areas) where the SAM films 2 are formed (the portions outside the thin pattern areas) in the left-most figures in FIGS. 3A, 3B, and 3C. The left-most figures in FIGS. 3A, 3B, and 3C show the corresponding cases in which the PZT precursor solution 5 is applied for the first time. The dimensions of the thin line pattern are only shown in the left-most figure in FIG. 3A. The dimensions of the thin line pattern are not shown in other figures of FIGS. 3A, 3B, and 3C. Similarly, the hatching is not applied to the figures in FIGS. 3A, 3B, and 3C other than the left-most figures in FIGS. 3A, 3B, and 3C.

Figure 2B:
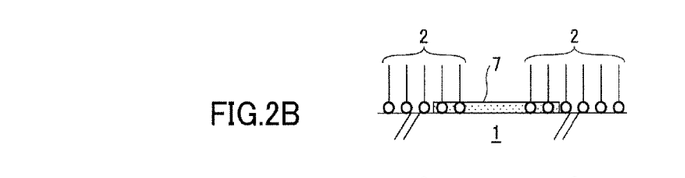

In the first embodiment, as shown in FIG. 2B and FIG. 3A, the liquid droplets 6 of the PZT precursor solution 5 are adhered to inside the application area in the predetermined pattern area (as a desired pattern area on the Pt surface on the 15 substrate 1), while the liquid droplets 6 are contacting the area outside the predetermined pattern (the SAM film 2).

Figure 2C:
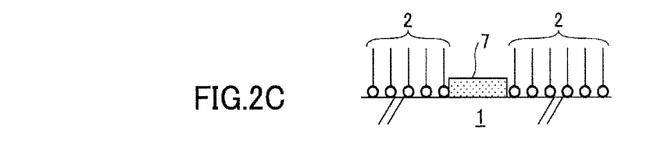

Namely, the dot diameter of each of the liquid droplets of the sol-gel solution 7, which have been attached to the desired pattern area, is set to 40 μm, so that the dot diameter is greater than the width of the thin line pattern (30 μm). As described above, the area outside the predetermined pattern area is a hydrophobic area, because of the SAM film 2. Further, the contact angle of the sol-gel solution with respect to the areas outside the predetermined pattern area is significantly greater than the contact angle of the sol-gel solution with respect to the predetermined pattern area, which is the hydrophilic area 4. As shown in FIG. 2B, the portions of the sol-gel solution droplets adhered to the area outside the predetermined pattern area are attracted toward inside the predetermined pattern area, and are leveled in the desired pattern, as shown in FIG. 2C. In this application process no mist was generated, and no isolated erroneous application of a fine sol-gel solution droplet was performed outside the predetermined pattern area.

Further, as shown in FIG. 3A, the neighboring dots are separated by a distance that prevents the neighboring dots from contacting with each other. The distance between the neighboring dots may be optimized depending on a drying rate of a solvent used in a solution to be applied and viscosity of the solution. However, it is preferable that the distance be greater than or equal to a half of the dot diameter R of the liquid droplet 6 adhered to the predetermined pattern area. With such a configuration, after the liquid droplets 6 are adhered to the predetermined pattern area, the neighboring dots are prevented from contacting with each other. Furthermore, cracks are prevented from occurring in the drying process, the thermal decomposition process, and the crystallization process. In the first embodiment in which the PZT precursor solution (sol-gel solution) is utilized, since the dot diameter of the adhered liquid droplets 6 is 40 μm, the distance between the neighboring dots is set to 40 μm (thinning rate is 1/2). In this case, after performing the application process for the first time, the formed neighboring dots did not contact with each other. Here, since the drying rate and the extent of the leveling of the PZT precursor solution 5 vary depending on a used solvent, the distance between the neighboring dots is not limited to the particular value described above. The distance between the neighboring dots (thinning rate) formed of the adhered liquid droplets 6 can be easily changed by image processing software on a control unit (computer) of the inkjet application device. In the first embodiment, as shown in FIGS. 3A and 3B, the thinning rates for the first application of the PZT precursor solution 5 are set to 1/2 and 1/3.

Further, as a comparative example shown in FIG. 3C, the application process was performed while setting the dot diameter of the liquid droplet 6 to 20 μm, and the distance between the neighboring dots to 40 μm (the thinning rate is 1/3). In the comparative example, the adhered liquid droplets 6 were not sufficiently leveled to reach the end portions in the width direction of the thin line patterned area. In addition, during the application process, mist of the sol-gel solution was generated at the nozzle hole of the inkjet head, from which the sol-gel solution droplets were discharged, and the dispersed as dots having a diameter of 4 μm to the areas outside the predetermined pattern area.

Second Embodiment

In a second embodiment, the PZT precursor solution 5 (sol-gel solution) is applied for the second time and after, similar to the method of forming the electromechanical transducer film according to the first embodiment. As it is shown in the example of FIG. 3A in which the PZT precursor solution 5 is applied for the second time, the PZT precursor solution 5 is applied to the substrate 1, so that the liquid droplets 6 of the PZT precursor solution 5 are adhered to specific portions of the desired pattern area (hydrophilic area 4), and that the center of each of the dots of the liquid droplets 6 is adhered to the center of the desired pattern area in the width direction. Here, the specific portions of the desired pattern area are the portions where the liquid droplets 6 have not been adhered to in the first time of the application. The portions of the liquid droplets 6 which have been adhered to the areas outside the desired pattern area are attracted toward inside the desired pattern area, and the liquid droplets 6 are leveled inside the desired pattern area, similar to the case of the first embodiment. Further, since in the dot-shaped PZT precursor films, which have previously been applied, a large fraction of the solvent has been dried as the time has passed, the newly applied PZT precursor solution 5 and the previously formed PZT precursor films do not clump together. Here, in the figures corresponding to the second application of the PZT precursor solution included in the figures of the fine line pattern areas of FIGS. 3A, 3B, and 3C, the portions 8-1 are the PZT film portions which have been formed through the drying process, the thermal decomposition process, and the crystallization process for the first time of the application. Each of the portions 8-1 has a shape like a vertically long ellipse, and is sandwiched between the substantially true circular dots of the liquid droplets 6 placed above and below it. In order to simplify the figures, the reference numerals are omitted for the PZT film portions which have been formed in the second application and after. However, the PZT film portions are the same as described above.

Figure 2D:
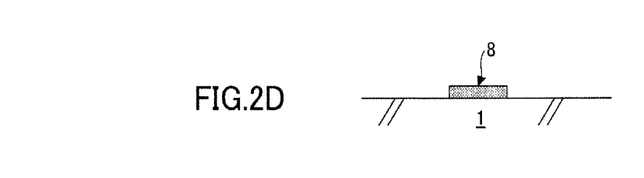

The above process was repeated until the desired pattern area was covered with the dots of the liquid droplets 6, thereby forming a single pattern layer (deposition) 7 (cf. FIG. 2B and FIG. 2C). Namely, the number of the applications is the reciprocal of the thinning rate. When the thinning rate is 1/2, the PZT precursor solution is applied twice, and when the thinning rate is 1/3, the PZT precursor solution is applied three times. In this manner, the single pattern layer 7 was formed. It is preferable that film thickness of the single pattern layer 7 obtained by the single pattern layer 7 be in a range from 100 to 150 nm. The density of the PIT precursor solution 5 is adjusted based on a relationship between a deposition area and an application amount of the PZT precursor solution 5. FIG. 2C shows a state in which the desired single pattern layer (deposition) 7 is formed by the inkjet application device. Because of the contrast between the contact angles, the PZT precursor solution 5 only spreads in the hydrophilic area, and forms the pattern. Then the single pattern layer 7 is heated (the solvent is completely dried) at 120 degrees Celsius (a first heating process), and subsequently organic matters are thermally decomposed. In this manner, the PZT film 8 shown in FIG. 2D was obtained. The film thickness of the OFT film 8 was 100 nm, and a film surface was uniformly formed.

Third Embodiment

Figure 2E:
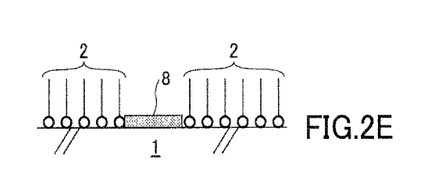
Figure 2F:
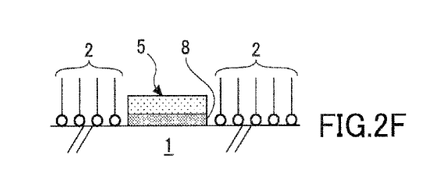
Figure 2G:
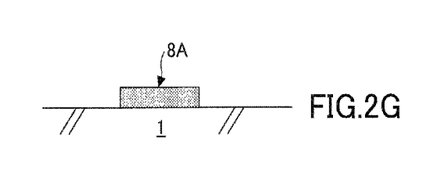

In a third embodiment, as a continuation and repetition process of the process of the second embodiment, the substrate 1 was rinsed with isopropyl alcohol and dipped into an alkanethiol solution. In this manner, the SAM film 2 was formed. Since the SAM film 2 was not formed on the oxide film on and after the second time, the pattern of the SAM film 2 was obtained without performing the photolithography process, as shown in FIG. 2E. The contact angle of pure water with respect to the SAM film 2 was 110 degrees, and the contact angle of pure water with respect to the PZT film 8 was 18 degrees. In this state, the target position was aligned to the position of the PZT film 8, which was formed when the application process was performed for the first time, and the PZT precursor solution (sol-gel solution) 5 was applied again to the substrate 1 by the method according to the first embodiment and the second embodiment using the inkjet application device. Similar to the cases of the first embodiment and the second embodiment, the portions of the liquid droplet 6 of the PZT precursor solution (sol-gel solution) 5 that were adhered to the areas outside the desired pattern areas were attracted toward inside the desired pattern area, and leveled within the desired pattern area. FIG. 2F shows this state. After performing the heating process, which was the same as the heating process for the first time, an overcoated PZT film 8A was obtained, as shown in FIG. 2G. The film thickness of the PZT film 8A was 200 nm. This process was additionally repeated 4 times, and the PZT film 8A having the thickness of 600 nm was obtained. Subsequently, a crystallization heat treatment (at 700 degrees Celsius) was performed as a rapid heat treatment (RHA). No cracks were found in the formed PZT film 8A. Additionally, the SAM film forming process, the PZT precursor application process, the drying process at 120 degrees Celsius, and the thermal decomposition process at 500 degrees Celsius were performed for 6 layers, and the crystallization heat treatment was performed. Again, no cracks were found in the formed PZT film 8A, and the thickness of the formed PZT film 3A was 1.2 μm.

Comparative Example

On the other hand, a PZT film was formed by the method shown in FIG. 3C. Here, the PZT film was formed by overcoating 12 layers of the PZT precursor layer. The width of the predetermined patterned film was 15 μm, and many cracks were found on the surface of the formed PZT film. Further, in the vicinity of the predetermined patterned film, many erroneous applications derived from the mist were scattered on the surface of the substrate (Pt film).

Figure 4:
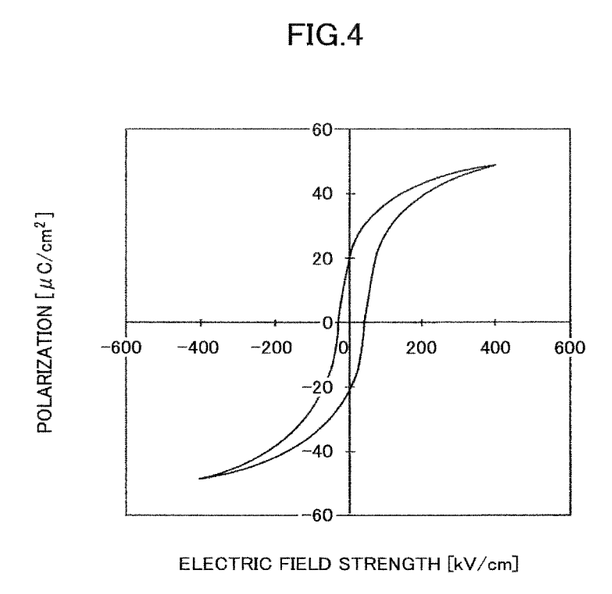
FIG. 4 is a graph showing an example of a P-E hysteresis curve.

An upper electrode (platinum) was formed on the PZT film 8A (film thickness of 1.2 μm) having the shape of the desired pattern. Here, the PZT film 8A was ultimately obtained in the third embodiment. The electrical characteristics and the electromechanical transducing function (piezoelectric constant) of the PZT film 8A were evaluated. The PZT film 8A was found to have a relative dielectric constant of 1600, a dielectric loss of 0.04, a residual polarization of 18.3 μC/cm$^2$, and a coercive electric field (electric field strength) of 36.2 kV/cm. Namely, it was found that the PZT film 8A had the same characteristics as those of a normal ceramic sintered body. FIG. 4 shows the P-E hysteresis curve of the PZT film 8A.

The amount of the deformation of the PZT film 8A was measured by a laser Doppler vibrometer. Then the measured amount was matched up with the simulated amount. In this manner, the electromechanical transducing function was evaluated. The piezoelectric constant $d_{31}$ of the PZT film 8A was 135 pm/V. Namely, it was also found that the electromechanical transducing function of the PZT film 8A was the same as that of the ceramic sintered body. These characteristics were sufficient for designing a liquid discharge head. Namely, the PZT film 8A can be used as a piezoelectric element. On the other hand, it was tried to increase the thickness of the electromechanical transducer film, without forming the upper electrode. Namely, the crystallization process was performed each time 6 layers of the PZT film was formed by thermal decomposition and annealing, and this process was repeated so as to form 24 layers of the PZT film. Then the patterned PIT film having thickness of 2.4 μm was obtained. No cracks were found in the formed PZT film.

As explained above, when the PZT precursor solution 5 is applied in accordance with any of the first through third embodiments, the liquid droplets 6 of the PZT precursor solution 5 are adhered to the predetermined pattern area and the liquid droplets 6 are leveled in a single application process, and no mist is generated in the process. The PZT film 8A, which forms the pattern layer, is produced by forming the predetermined pattern layers by repeating this application method. Here, the PZT film 8A is densely formed without erroneous application, and the PZT film 8A has a uniform film thickness. Therefore, in the method of forming the electromechanical transducer film (PZT precursor film) by the sol-gel method, cracks are prevented from being generated in the drying process, the thermal decomposition process, and the crystallization process. Further, the electromechanical transducer film (PZT precursor film) formed in this manner demonstrates fine electric characteristics.

Fourth Embodiment

Figure 5:
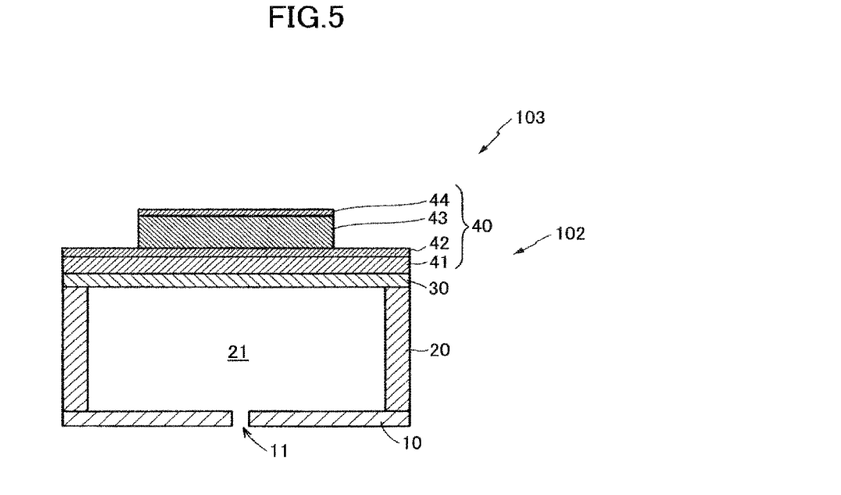
FIG. 5 is a cross-sectional view of major portions of an ink cartridge according to a fourth embodiment, which includes an electromechanical transducer element including the electromechanical transducer film according to the first through third embodiments.

Next, an ink cartridge 103 according to a fourth embodiment is explained by referring to FIG. 5. The ink cartridge 103 is formed by integrating an inkjet head 102 having an electromechanical transducer element 40 and an ink tank (not shown) that supplies ink to the inkjet head 102. The electromechanical transducer element 40 includes an electromechanical transducer film 43 formed by a method according to any of the first through third embodiments. The inkjet head 102 includes a nozzle 11, a liquid chamber 21, and the electromechanical transducer element 40. The nozzle 11 is formed in a nozzle plate 10 and discharges ink droplets. The liquid chamber 21 is also referred to as a pressure chamber, and the liquid chamber 21 communicates with the nozzle 11. The electromechanical transducer element 40 is for generating pressure that causes the ink (not shown) inside the liquid chamber 21 to be discharged. The liquid chamber 21 is formed as a space by arranging liquid chamber substrates 20 formed of Si substrates on the nozzle plate 10.

The electromechanical transducer element 40 is a piezoelectric type transducer such that it causes the ink inside the liquid chamber 21 to be discharged by deforming the oscillation plate 30. The oscillation plate 30 is placed at the opposite side of the nozzle plate 10 and forms a wall surface of the liquid chamber 21. On the oscillation plate 30 formed of the Si substrate, an oxide electrode 41 is formed. A platinum electrode 42, which is a first electrode, is formed on the oxide electrode 41. The electromechanical transducer film 43 is formed on the platinum electrode 42, and an upper electrode 49, which is a second electrode, is formed on the electromechanical transducer film 43. Namely, the electromechanical transducer film 43 is disposed between the oxide electrode (first electrode) 41 and the upper electrode (second electrode) 44.

For the case of the ink cartridge 103 integrating the ink tank and including the inkjet head 102 having such a structure, the reduction of the cost and the improvement in the reliability of the inkjet head 102 are directly liked to the reduction of the cost and the improvement in the reliability of the whole ink cartridge 103. Therefore, as described above, the yield rate and reliability of the ink cartridge 103 can be improved and the cost of the ink cartridge 103 can be reduced by reducing the cost and improving the reliability of the inkjet head 102.

Fifth Embodiment

Figure 6:
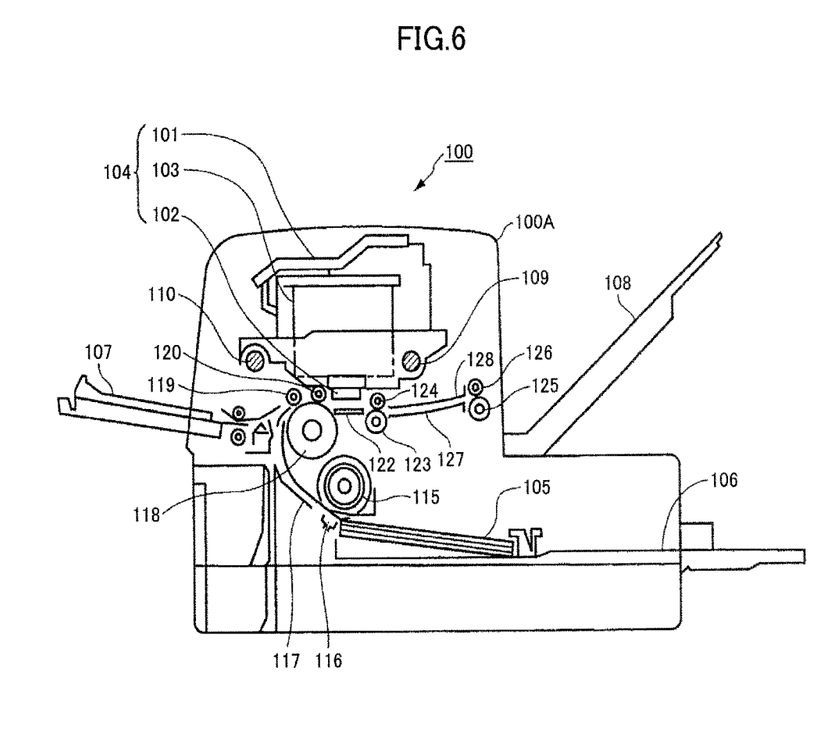
FIG. 6 is a schematic cross-sectional front view of a portion of mechanical portions of an inkjet recording device according to a fifth embodiment.
Figure 7:
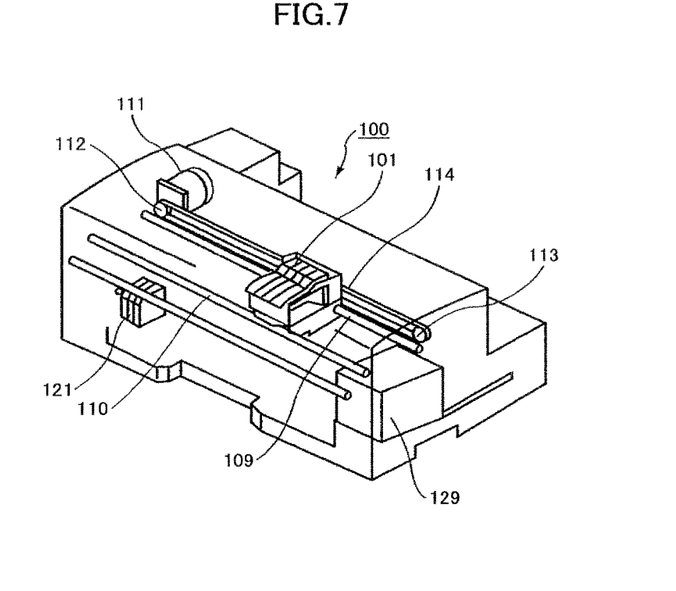

Next, an example of an inkjet recording device is explained by referring to FIGS. 6 and 7. The inkjet recording device as an image forming device includes the ink cartridge 103 including the inkjet head 102 according to the fourth embodiment. FIG. 6 is a partial cress-sectional front view schematically showing mechanical portions of the inkjet recording device. FIG. 7 is a schematic perspective view in which major portions of the inkjet recording device are see through. The inkjet recording device 100 is a so-called "serial-type inkjet recording device." The inkjet recording device 100 includes a print unit 104. The print unit 104 includes a carriage 101, an inkjet head 102 according to the fourth embodiment, and the ink cartridge 103. The print unit 104 is stored inside the main body 100A of the inkjet recording device 100. The carriage 101 is movable in the main scanning direction. The inkjet head 102 (also referred to as the recording head 102) is mounted on the carriage 101. The ink cartridge 103 supplies ink to the recording head 102.

A paper feed cassette 106 can be detachably attached to a lower part of the main body 100A from the front side (the left hand side in FIG. 6). Many sheets of recording paper 105 can be stored in the paper feed cassette 106. Additionally, the main body 100A includes an operable and closeable manual feed tray 107 for manually feeding the sheets of recording paper 105. The inkjet recording device 100 takes in the sheet of recording paper 105 fed from the paper feed cassette 106 or the manual feed tray 107, then the print unit 104 prints a desired image onto the sheet of the recording paper 105, and subsequently the inkjet recording device 100 discharges the sheet of recording paper 105 onto a paper discharge tray 108 attached to a rear surface side of the main body 100A. Here, the paper feed cassette 106 may be a paper feed tray.

In the print unit 104, the carriage 101 is supported by a main guide rod 109 and a sub guide rod 110, so that the carriage 101 can be slid in the main scanning direction. The main guide rod 109 and the sub guide rode 110 are horizontally supported by left and right side plates (not shown). The inkjet head (recording head) 102 according to the fourth embodiment is attached to the carriage 101. The inkjet head 102 includes plural ink discharge ports (the nozzle 11 in FIG. 5) for discharging yellow (Y) ink, cyan (C) ink, magenta (M) ink, and black (Bk) ink. The plural ink discharge ports are arranged in a direction intersecting the main scanning direction. The ink discharging direction is directed downward.

Ink cartridges 103 corresponding to yellow, cyan, magenta, and black, respectively, are exchangeably attached to the carriage 101. The ink cartridges 103 are for supplying the yellow ink, the cyan ink, the magenta ink, and the black ink, respectively, to the inkjet head 102. Each of the ink cartridges 103 includes an air inlet that communicates with the outside air; a supply port for supplying the corresponding ink to the inkjet head 102; and a porous body filled with the corresponding ink. Here, the air inlet is arranged at an upper portion of the ink cartridge 103, the supply port is arranged at a lower portion of the ink cartridge 103, and the porous body is disposed inside the ink cartridge 103. The pressure of the ink supplied to the inkjet head 102 is kept slightly negative by the capillary force of the porous body. Here, as the recording head, the inkjet heads 102 corresponding to yellow, cyan, magenta, and black are utilized. However, the recording head may be a single head having nozzles for discharging yellow (Y) ink droplets, cyan (C) ink droplets, magenta (M) ink droplets, and a black (Bk) ink droplets. As shown in FIG. 7, a rear side of the carriage 101 (downstream side in the sheet conveyance direction) is slidably supported by the main guide rod 109, and a front side of the carriage 101 (upstream side in the sheet conveyance direction) is slidably placed on the sub guide rod 110. A timing belt 114 is wound around a drive pully 112 and a driven pully 113. The drive pully 112 is rotationally driven by a main scanning motor 111. The timing belt 114 is fixed to the carriage 101, so that the carriage 101 can be moved and can scan in the main scanning direction. The carriage 101 can be reciprocated in the main scanning direction by the forward and reverse rotations of the main scanning motor 111.

On the other hand, the inkjet recording device 100 includes a sheet feeding roller 115 and a friction pad 116 for feeding the recording papers 105 from the paper feed cassette 106 and for separating the recording papers 105; a guide member 117 for guiding the recording paper 105; a conveyance roller 118 that inverts the recording paper 105 being fed and conveys the recording paper 105; a pressing roller 119 that is pressed to a peripheral surface of the conveyance roller 118; and a top end roller 120 that defines an angle of sending the recording paper 105 from the conveyance roller 118, so as to convey the recording paper 105 being set in the sheet feeding cassette 106 to a portion below the inkjet head (recording head) 102.

The conveyance roller 118 is rotationally driven by a sub-scanning motor (not shown) through a sequence of gears. At the portion facing the inkjet head (recording head) 102, a print support member 122 is disposed. The longitudinal length of the print support member 122 corresponds to a moving range in the scanning direction of the carriage 101. The print support member 112 is for guiding the recording paper 105 sent out from the conveyance roller 118 at the portion facing (below) the inkjet head (recording head) 102. At the downstream side in the sheet conveyance direction of the printing support member 122, the inkjet recording device 100 further includes a conveyance roller 123 and a spur 124 that are rotationally driven so as to send the recording paper 105 in a recording paper discharging direction; a paper eject roller 125 and a spur 126 for sending the recording paper 105 onto the paper discharge tray 108; and guide members 127 and 128 that form a paper ejection path.

When the inkjet recording device 100 prints an image, the inkjet head recording device 100 drives the inkjet head (recording head) 102 so as to discharge the yellow ink, the cyan ink, the magenta ink, and/or the black ink in accordance with an image signal, while moving the carriage 101. In this manner, the inkjet head (recording head) 102 discharges the yellow ink, the cyan ink, the magenta ink, and/or the black ink toward the recording paper 105, which remains stationary, and printing corresponding to one line is completed. Subsequently, the inkjet recording device 100 prints the next line, after moving the recording paper 105 by a predetermined distance. When the inkjet recording device 100 receives a printing termination signal or a signal indicating that the end of the recording paper 105 has reached the printing area, the inkjet recording device 100 terminates the printing operation and ejects the recording paper 105. Further, the inkjet recording device 100 includes a recovering device 129 for recovering a discharge failure of the inkjet head (recording head) 102. The recovering device 129 is disposed at a position outside the printing area. Here, the position is at a rightmost side in a direction in which the carriage 101 moves. The recovering device 129 includes a cap unit, a suction unit, and a cleaning unit. During the print waiting state, the carriage 101 is moved to the side of the recovering device 129, and the inkjet head (recording head) 102 is capped by the cap unit. In this manner, the wet conditions of the discharging ports are maintained, and a discharge failure caused by ink drying is prevented. Additionally, during printing, the inkjet recording device 100 causes the inkjet head (recording head) 102 to discharge ink that is not related to printing. In this manner ink viscosities at all the discharging ports are kept constant, and a stable discharging performance is maintained.

When a discharge failure occurs, the inkjet recording device 100 causes the cap unit to seal the discharging ports (nozzles) of the inkjet head (recording head) 102. Then the suction unit suctions babbles along with the ink from the discharging ports through a tube. The cleaning unit removes the ink or dusts attached to a surface of the discharging ports. In this manner, the discharge failure is recovered. The suctioned ink is discharged to a waste ink reservoir (not shown) disposed at a lower portion of the main body of the inkjet printer, and an ink absorber in the waste ink reservoir absorbs and reserves the suctioned ink.

As described above, since the inkjet recording device 100 includes the inkjet head (recording head) 102 according to the fourth embodiment, an ink discharging failure caused by a failure for driving the oscillation plate 30 is prevented. Therefore, a stable ink discharging characteristic is obtained and the quality of the image is improved.

In the above embodiments, the configurations and/or the methods described below have been adopted. The method according to the first embodiment includes the surface modification process of partially modifying the surface of the first electrode; the application process for partially applying the sol-gel solution onto the surface of the first electrode by the inkjet method, the surface of the first electrode having been modified by the surface modification process; and the drying process, the thermal decomposition process, and the crystallization process for drying, thermally decomposing, and crystallizing the sol-gel solution, the sol-gel solution having been applied onto a portion of the surface of the first electrode by the application process. The electromechanical transducer film having the desired thickness is formed on the desired pattern area by the sol-gel method, in which the surface modification process, the application process, the drying process, the thermal decomposition process, and the crystallization process are repeatedly applied. In the application process, the sol-gel solution droplets that are applied by the inkjet method are dropped onto the surface of the electrode, so that the sol-gel solution droplets are adhered to both inside the desired pattern area corresponding to the hydrophilic area where the surface is modified by the surface modification process and the area outside the desired pattern area corresponding to the hydrophobic area where the surface is modified by the surface modification process.

In the first embodiment, the configuration may be adopted such that, in the electromechanical transducer forming method, the diameter of the adhered dots of the sol-gel solution droplets is greater than the length of the short edge of the desired pattern area. Further, in the electromechanical transducer film forming method according to the first embodiment, the contact angle of the sol-gel solution with respect to the area outside the desired pattern area is greater than the contact angle of sol-gel solution with respect to the area inside the desired pattern area.

The configurations described in the second embodiment include the configuration of the electromechanical transducer film, which is formed of the layers. Here, the layers are formed by sequentially repeating dropping of the sol-gel solution droplets onto the area inside the desired pattern area and the area outside the desired pattern area, in accordance with the first embodiment. The configurations described in the third embodiment include the configuration of the electromechanical transducer film formed by superposing the layers. Here, the layers are formed by sequentially repeating dropping of the sol-gel solution droplets onto the area inside the desired pattern area and the area outside the desired pattern area, in accordance with the first embodiment. The configurations described in the fourth embodiment include the configuration of the electromechanical transducer element such that the electromechanical transducer film is disposed between the first electrode and the second electrode. Here, the electromechanical transducer film has a configuration according to the second embodiment or the third embodiment.

Additionally, the configuration described in the fourth embodiment include the above electromechanical transducer element, in which the electromechanical transducer film is formed of a metal complex oxide, and the top surfaces of the first electrode and the second electrode are covered with the corresponding films formed of a platinum group metal, its oxide, or a laminated film thereof. In the fifth embodiment, the configuration of the liquid discharge head is described. The liquid discharge head includes the electromechanical transducer element according to the fourth embodiment. Additionally, in the fifth embodiment, the image forming device having the above liquid discharge head is described.

The inkjet head 102 has been explained as an example of the liquid discharge head including the electromechanical transducer element 40 according to the fourth embodiment. However, the embodiment of the present invention is not limited to this. For example, the liquid discharge head can discharge fine droplets of an arbitrary liquid, instead of the ink. Additionally, the liquid discharge head can be utilized for a patterning device or the like.

The image forming device according to the embodiment of the present invention is not limited to the inkjet recording device 100 shown in FIGS. 6 and 7. For example, the image forming device according to the embodiment of the present invention includes en image forming device, such as a printer, a plotter, a word processor, a facsimile machine, a copier, a screen printing machine, and a compound machine having two or more of these functions, which includes the inkjet recording device according to the embodiment of the present invention. The technical field of the embodiments includes the field of printing technology, especially, the field of digital printing technology. Examples of the image forming device include a digital printing device that utilizes a multi-function printer, and a printer and a multi-function printer which are utilized in an office environment or in a personal environment. Further, the technical field of the embodiments includes the field of the three-dimensional rendering technology, in which the inkjet technology is utilized. Further, the recording medium and/or sheet is not limited to the sheet 105. The recording medium and/or sheet includes all the recording media and sheets on which images can be formed by using the inkjet head, such as thin paper, cardboard, a post card, an envelope, or an OHP sheet.

The present invention is not limited to the specifically disclosed embodiments, and variations and modifications may be made without departing from the scope of the present invention.

The present application is based on Japanese Priority Application No. 2011-129418, filed on Jun. 9, 2011, the entire contents of which are hereby incorporated herein by reference.

What is claimed is:

1. An electromechanical transducer element forming method comprising:
   forming a first electrode;
   forming a second electrode; and
   forming an electromechanical transducer film disposed between the first electrode and the second electrode,
   wherein the electromechanical transducer film is formed as layers, wherein the layers are formed by repeatedly performing a method including
   a surface modification process of modifying a portion of a surface of a first electrode;
   an application process of applying a sol-gel solution to the portion of the surface of the first electrode by an inkjet method, the portion of the surface of the first electrode having been modified by the surface modification process; and
   processes of drying, thermally decomposing, and crystallizing the sol-gel solution applied to the portion of the surface of the first electrode by the application process,
wherein each of the layers having a desired thickness is formed on a thin line desired pattern area on the surface of the first electrode by repeating the surface modification process, the application process, and the processes of drying, thermally decomposing, and crystallizing the sol-gel solution,
wherein, in the application process of the method, each of dots of the sol-gel solution applied by the inkjet method covers both of (i) a first area inside the thin line desired pattern area and (ii) a second area outside the thin line desired pattern area, and
wherein the first area is included in a hydrophilic area on the surface of the first electrode, the hydrophilic area having been modified by the surface modification process, and the second area is included in a hydrophobic area on the surface of the first electrode, the hydrophobic area having been modified by the surface modification process,
wherein the dots are leveled to reach an end portion in a width direction of the thin Line desired pattern area, and
wherein the leveled dots attached to the desired pattern area have a dot diameter greater than the width of the thin line desired pattern area.

2. The electromechanical transducer element forming method according to claim 1,
   wherein the electromechanical transducer film is formed of a metal complex oxide, and
   wherein the first electrode is formed of a platinum group metal, an oxide of a platinum group metal, or a laminated film including several types of platinum group metals and/or oxides of several types of platinum group metals.

3. A method for forming a liquid discharge head, including performing an electromechanical transducer element forming method to form an electromechanical transducer element, the electromechanical transducer element forming method comprising:
   forming a first electrode;
   forming a second electrode; and
   forming an electromechanical transducer film disposed between the first electrode and the second electrode,
wherein the electromechanical transducer film is formed as layers,
wherein the layers are formed by repeatedly performing a method including
   a surface modification process of modifying a portion of a surface of a first electrode;
   an application process of applying a sol-gel solution to the portion of the surface of the first electrode by an inkjet method, the portion of the surface of the first electrode having been modified by the surface modification process; and
   processes of drying, thermally decomposing, and crystallizing the sol-gel solution applied to the portion of the surface of the first electrode by the application process,
wherein each of the layers having a desired thickness is formed on a thin line desired pattern area by repeating the surface modification process, the application process, and the processes of drying, thermally decomposing, and crystallizing the sol-gel solution,
wherein, in the application process of the method, each of dots of the sol-gel solution applied by the inkjet method covers both of (i) a first area inside the thin line desired pattern area and (ii) a second area outside the thin line desired pattern area, and
wherein the first area is included in a hydrophilic area on the surface of the first electrode, the hydrophilic area having been modified by the surface modification process, and the second area is included in a hydrophobic area on the surface of the first electrode, the hydrophobic area having been modified by the surface modification process,
wherein the dots are leveled to reach an end portion in a width direction of the thin line desired pattern area, and
wherein the leveled dots attached to the desired pattern area have a dot diameter greater than the width of the thin line desired pattern area,
wherein the electromechanical transducer film is formed of a metal complex oxide, and
wherein the first electrode is formed of a platinum group metal, an oxide of a platinum group metal, or a laminated film including several types of platinum group metals and/or oxides of several types of platinum group metals.

* * * * *